(12) United States Patent
Agrawal et al.

(10) Patent No.: US 6,881,613 B2
(45) Date of Patent: Apr. 19, 2005

(54) ELECTRONIC COMPONENT PACKAGE

(75) Inventors: Gaurav Agrawal, Orefield, PA (US);
Jesse W. Booker, Allentown, PA (US);
Christopher E. Sosh, Temple, PA (US)

(73) Assignee: Agere Systems Inc, Allentown, PA (US)

( * ) Notice: Subject to any disclaimer, the term of this patent is extended or adjusted under 35 U.S.C. 154(b) by 192 days.

(21) Appl. No.: 10/266,267

(22) Filed: Oct. 8, 2002

(65) Prior Publication Data

US 2004/0065950 A1 Apr. 8, 2004

(51) Int. Cl.[7] .......................... H01L 21/44; H01L 21/50
(52) U.S. Cl. ...................... 438/118; 438/123; 438/124; 438/127
(58) Field of Search .................... 438/106, 111, 438/112, 118, 121, 123, 124, 125, 126, 127

(56) References Cited

U.S. PATENT DOCUMENTS

| | | | | |
|---|---|---|---|---|
| 5,569,958 A | * | 10/1996 | Bloom | 257/698 |
| 5,959,354 A | * | 9/1999 | Smith et al. | 257/734 |
| 6,209,352 B1 | * | 4/2001 | Beall et al. | 65/30.1 |
| 6,335,548 B1 | * | 1/2002 | Roberts et al. | 257/98 |
| 6,384,473 B1 | * | 5/2002 | Peterson et al. | 257/680 |
| 2002/0132463 A1 | * | 9/2002 | Urushima | 438/613 |

* cited by examiner

*Primary Examiner*—Amir Zarabian
*Assistant Examiner*—Pamela Perkins

(57) ABSTRACT

An electronic component package and method of fabrication is provided. The electronic component package includes a ceramic substrate and a plurality of bonding pads formed on the substrate, each pad forming an interface with the ceramic. Formed on the bonding pads is a bonding material, and a plurality of electrical leads are secured to corresponding pads by the bonding material. A layer of adhesive is formed over at least the interfaces between the pads and ceramic.

9 Claims, 3 Drawing Sheets

ELECTRONIC COMPONENT PACKAGE

FIELD OF THE INVENTION

The present invention relates generally to electronic components, and, more particularly, to a package for semiconductor IC and optoelectronic components.

BACKGROUND OF THE INVENTION

In the field of semiconductor component fabrication, packaging of the component is a key step in ensuring reliability at an acceptable cost. For example, in many types of Integrated Circuit (IC) and optoelectronics devices, the component is bonded to a ceramic substrate, and electrical connection is provided between the component and outside circuitry by electrical leads which are attached to the substrate, usually by brazing. These leads are usually straight when attached, but are subsequently bent to permit attachment to a printed circuit board.

Unfortunately, bending of the leads tends to cause cracking of the ceramic around the brazing sites, which can cause destruction of the electrical connections. This problem is especially acute for RF devices where the length of the leads and ceramic layer thicknesses are constrained due to needed RF performance.

It is desirable, therefore, to provide an electronic package and method of fabrication which reduces the cracking of ceramic material due to lead formation.

SUMMARY OF THE INVENTION

In accordance with one aspect, the invention is an electronic component package including a ceramic substrate. A plurality of bonding pads are formed on the substrate, each pad forming an interface with the ceramic. Formed on the bonding pads is a bonding material, and a plurality of electrical leads are secured to corresponding pads by the bonding material. A layer of adhesive is formed over at least the interfaces between the pads and ceramic.

In accordance with another aspect, the invention is a method of fabricating an electronic component package which includes a ceramic substrate, a plurality of bonding pads formed on the substrate, each pad forming an interface with the ceramic, a bonding material formed over the pads, and a plurality of electrical leads secured by the bonding material to corresponding pads. The method includes the steps of depositing an adhesive material over at least the interfaces between the pads and ceramic, and bending the leads into a desired shape.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice in the semiconductor industry, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
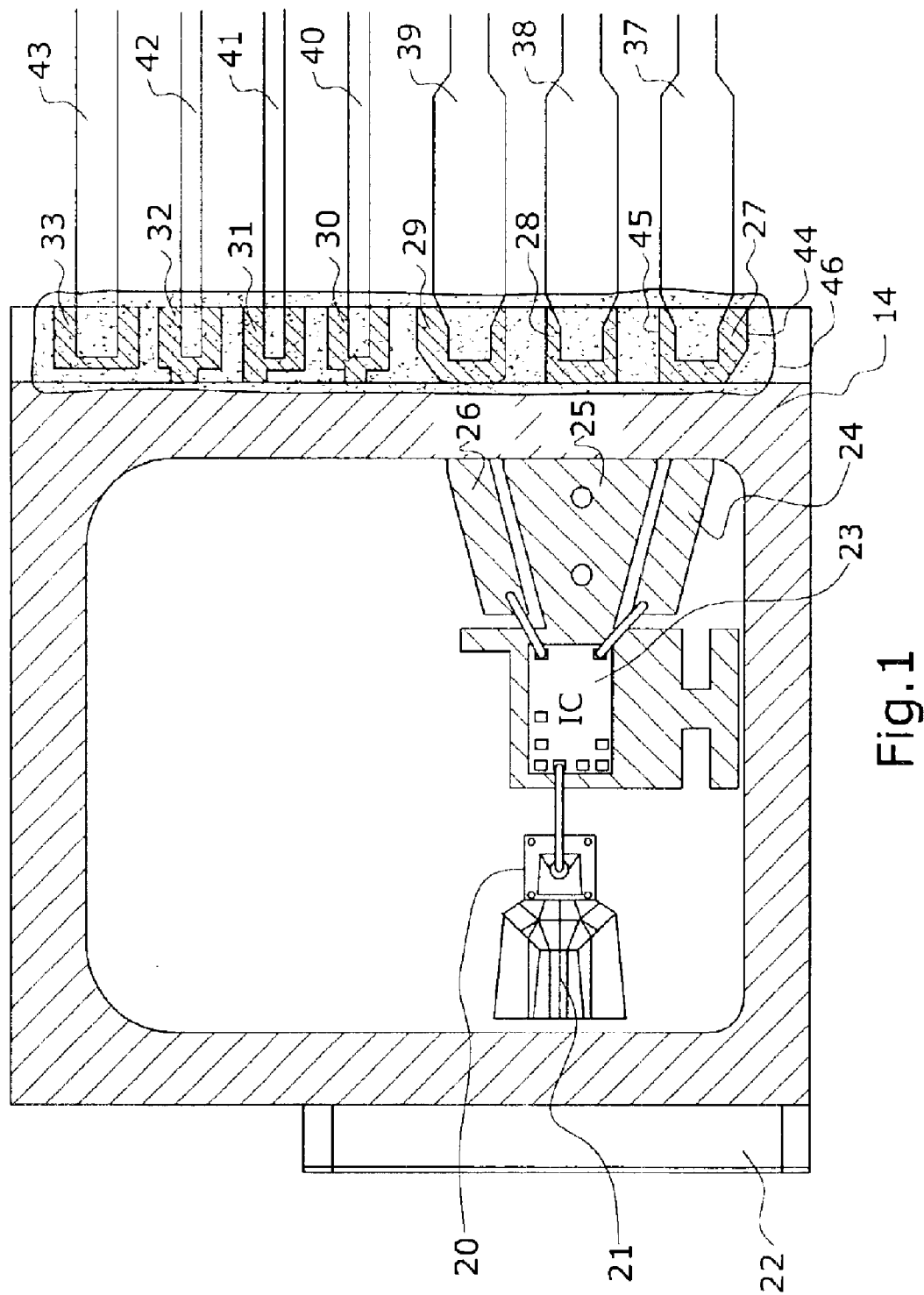
FIG. 1 is a top view of a typical component package during one stage of fabrication which may employ an embodiment of the present invention.

Referring now to the drawing, wherein like reference numerals refer to like elements throughout, FIG. 1 is a typical package design in one stage of fabrication employing features of the invention. In this example, the package, 10, is an optoelectronic package, but the invention is not so limited. The package (see also FIGS. 2 and 3) includes a ceramic substrate, 11, which includes a solid dielectric portion 12, and a metallized portion 13. As known in the art, the metallized portion, 13, usually includes several layers of metal and ceramic. The package housing is formed by ceramic walls, 14, formed on the substrate.

Within the housing, 14, is an optical device, 20, which in this example is a photodetector, but could also be a light source such as a laser. The device, 20, is bonded to the substrate typically by epoxy or solder. A V-shaped groove, 21, is formed in the substrate, 11, which could be used for accommodating an optical fiber (not shown) connected to the package through a port, 22, by a standard connector such as an LC connector (not shown). Alternatively, where the device 20 is a laser, light could be coupled by free space optics from the laser into an LC connector and the V-groove would not be needed. The photodetector, 20, is electrically connected to standard driver circuitry formed in an Integrated Circuit chip, 23. The IC chip, 23, is electrically connected by means of connectors, 24,25,26, to corresponding bonding pads, 27, 28, 29. It will be appreciated that the package also includes other components, such as parallel plate capacitors, which are not shown for purposes of simplicity in the figure. However, for the sake of illustration, the bonding pads for these components are shown as pads 30–33. The connectors are typically made of an alloy of iron, nickel, and cobalt, commonly known as Kovar®. The pads, 27–33 are typically formed as extensions of the connectors outside the walls, 14, but also include a layer, eg, 50 of FIGS. 2 and 3, of a material such as gold which can be brazed. The pads typically extend around the edges of the metallized portion, 13, as illustrated. (See also FIG. 4.).

Electrical connection of the package components is accomplished by use of a plurality of electrical leads, 37–43, which are attached to corresponding pads, 27–33. The leads in this example are made of Kovar®, but could be any metal. The leads, 37–43 are attached to their corresponding pads, 27–33 using a standard brazing technique, but could be attached by other methods such as soldering.

It will be noted that each of the bonding pads, e.g., 27, forms an interface, eg, 44 and 45, with the ceramic material in portion, 13, of the package. Bending of the leads, 37–43, tends to cause cracks in the ceramic at these interfaces which in turn can adversely affect electrical connections to the components in the package.

Figure 4:
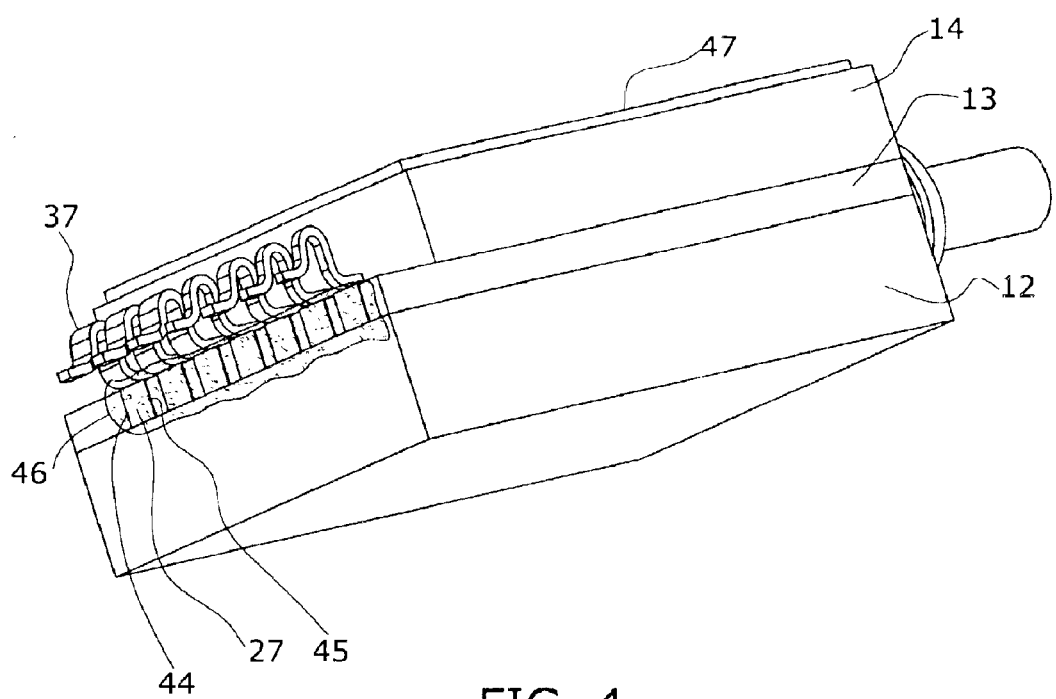
FIG. 4 is a perspective view of an essentially completed package of the type illustrated in FIG. 1.

Applicants have discovered that this cracking problem can be alleviated or eliminated by depositing an adhesive layer, 46, over the bonding pads, 27–33, on the top portion of the pads illustrated in FIG. 1, and on the edge portion of the pads, illustrated in FIG. 4. For convenience, the adhesive layer, 46, is deposited over the entire top and edge portions of the metallized portion, 13. However, it should be sufficient to at least cover each of the interfaces, eg, 44 and 45, between the pads and ceramic on the top and edge portions.

In this example, the adhesive was a standard commercially available epoxy comprising a conventional epoxide resin with or without particulate additives such as fumed silica or aluminum nitride, which was deposited using a syringe. The thickness of the layer was approximately 0.005 inches, but thicknesses in the range 0.001 to 0.02 inches should be useful. The adhesive can be other materials such as acrylates. In general, it is expected that any polymeric adhesive would be useful. Other methods of deposition could also be employed.

Thus, it will be appreciated that although the leads, 37–43, are already firmly attached to the pads by brazing or other techniques, the adhesive layer, 46 is added primarily to prevent the cracking of the ceramic material. While not being bound by any theory, it is believed that the adhesive alters the elastic modulus in the region of the ceramic-metal interfaces and thereby absorbs stresses during the bending process. It is recommended, therefore, that the adhesive have an elastic modulus in the range 50,000 to 450,000 psi at room temperature, although materials outside this range could be used.

Figure 2:
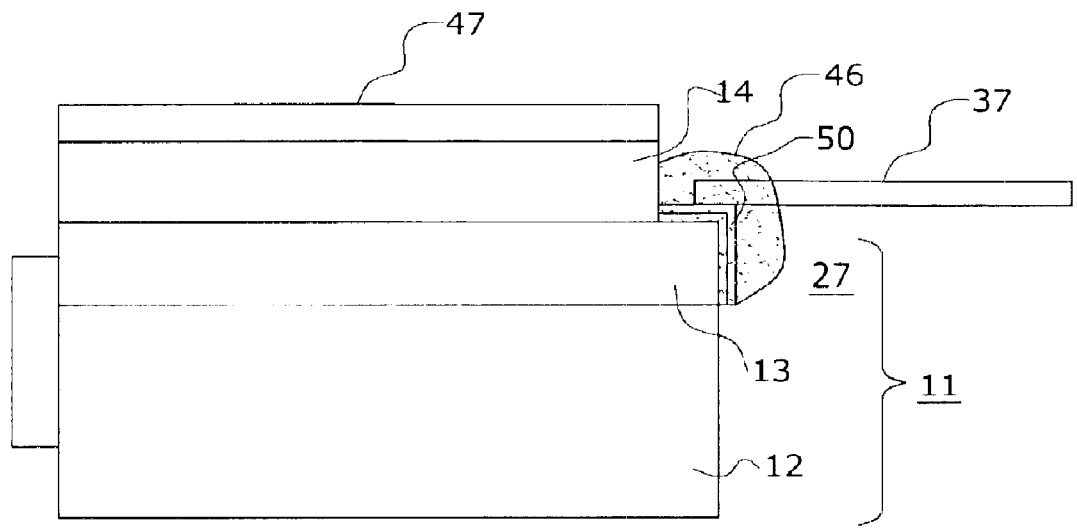
FIGS. 2–3 are side views of the package of FIG. 1 during various stages of fabrication.
Figure 3:
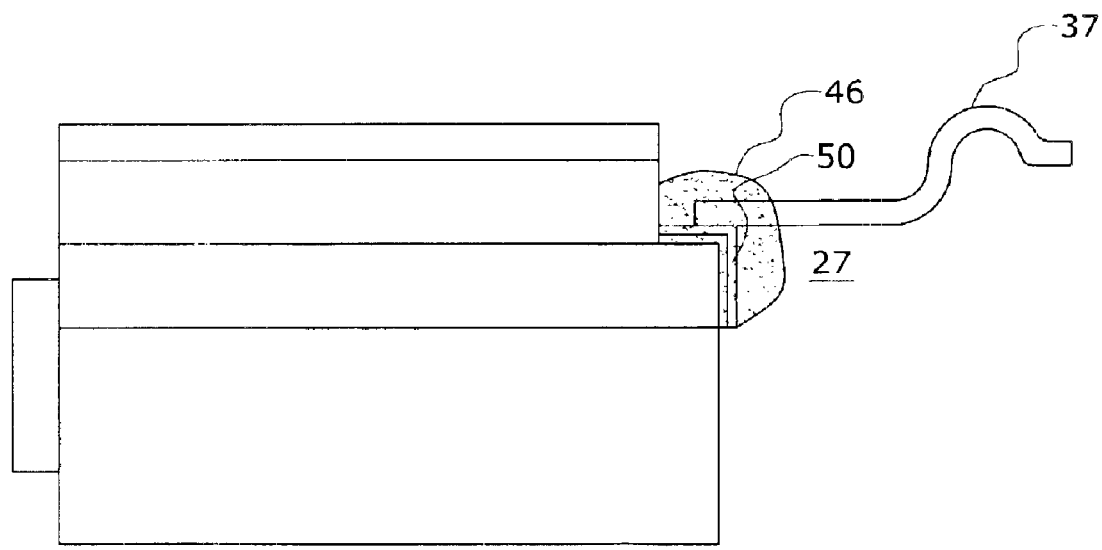

FIG. 2 shows a side view of the package of FIG. 1 after a lid, 47, has been mounted to the ceramic housing, 14, by standard techniques. The lid may be attached either before or after the application of the adhesive layer, 46. FIG. 3 shows the package after the leads, eg, 37, are bent for example by cold forming. The shape of the leads is chosen to permit bonding of the package to a standard printed circuit board (not shown). Other desired shapes may be used according to particular needs. FIG. 4 illustrates an essentially completed package.

In present standard packaging techniques, bending of the leads usually results in cracking of 15–50 percent of the packages. However, use of the features of the invention has essentially eliminated the cracking during lead formation using 0.01 inch thick leads. This result is especially important for RF component packages (where devices operate at 155 mbit per second or above) since the length of the leads and the thicknesses of the ceramic portions are constrained by device performance. In particular, the length of the leads is preferably no greater than 0.115 inches, and the thickness of the ceramic layer, 13, is preferably no less than 0.008 inches. Further, the invention allows the use of thick leads (at least 0.01 inches thick) which will not result in handling problems during manufacture.

Although the invention has been described with reference to exemplary embodiments, it is not limited to those embodiments. Rather, the appended claims should be construed to include other variants and embodiments of the invention which may be made by those skilled in the art without departing from the true spirit and scope of the present invention. For example, while the adhesive layer, 46, would normally remain as a permanent part of the package, there may be applications where it is desired to remove the adhesive after the leads have been bent.

What is claimed:

1. A method of fabricating an electronic component package which includes a ceramic substrate, a plurality of bonding pads formed on the substrate, each pad forming an interface with the ceramic, a bonding material formed over the pads, and a plurality of electrical leads secured by the bonding material to corresponding pads, the method comprising the steps of:

depositing an adhesive material over at least the interfaces between the pads and ceramic; and bending the leads into a desired shape.

2. The method according to claim 1 wherein the adhesive is a polymeric adhesive.

3. The method according to claim 2 wherein the adhesive is an epoxy.

4. The method according to claim 1 wherein the thickness of the adhesive is in the range 0.001 to 0.02 inches.

5. The method according to claim 1 wherein the bonding pads extend from a top portion of the ceramic and along an edge portion of the ceramic, and the adhesive layer is formed on the entire top and edge portions including the pads.

6. The method according to claim 1 wherein the bonding material is a brazing material.

7. The method according to claim 1 wherein the leads are bent by cold forming.

8. The method according to claim 1 wherein the adhesive has an elastic modulus in the range 50,000 to 450,000 psi at room temperature.

9. The method according to claim 1 wherein the leads are bent after the adhesive material is deposited.

* * * * *